US010199987B2

(12) United States Patent
Chen et al.

(10) Patent No.: US 10,199,987 B2
(45) Date of Patent: Feb. 5, 2019

(54) SELF-RECONFIGURABLE RETURNABLE MIXER

(71) Applicant: SOUTHEAST UNIVERSITY, Nanjing (CN)

(72) Inventors: Chao Chen, Nanjing (CN); Jianhui Wu, Nanjing (CN); Hong Li, Nanjing (CN); Cheng Huang, Nanjing (CN); Meng Zhang, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 15/776,780

(22) PCT Filed: Jan. 29, 2016

(86) PCT No.: PCT/CN2016/072709
§ 371 (c)(1),
(2) Date: May 16, 2018

(87) PCT Pub. No.: WO2017/084213
PCT Pub. Date: May 26, 2017

(65) Prior Publication Data
US 2018/0331656 A1    Nov. 15, 2018

(30) Foreign Application Priority Data
Nov. 16, 2015  (CN) .......................... 2015 1 0786670

(51) Int. Cl.
*H03D 7/14*    (2006.01)
*H03D 7/16*    (2006.01)

(52) U.S. Cl.
CPC ......... *H03D 7/1491* (2013.01); *H03D 7/1441* (2013.01); *H03D 7/1458* (2013.01); *H03D 7/16* (2013.01)

(58) Field of Classification Search
CPC ... H03D 7/1491; H03D 7/1441; H03D 7/1458
(Continued)

(56) References Cited

U.S. PATENT DOCUMENTS

| 8,120,426 B1 * | 2/2012 | Granger-Jones | ...... H03F 1/0277 330/253 |
| 2013/0300490 A1 * | 11/2013 | Wu | ...................... H03D 7/1425 327/355 |

FOREIGN PATENT DOCUMENTS

| CN | 102082579 A | 6/2011 |
| CN | 102111109 A | 6/2011 |

(Continued)

*Primary Examiner* — Thomas Skibinski
(74) *Attorney, Agent, or Firm* — Gokalp Bayramoglu

(57) ABSTRACT

A self-reconfigurable returnable mixer includes a self-reconfigurable transconductance stage. The input RF voltage signal is converted into RF current through the self-reconfigurable transconductance stage. The RF current is converted into an IF signal through down-conversion and low-pass filtering. The IF signal is fed back to the reconfigurable transconductance stage; the self-reconfigurable transconductance stage presents an open-loop structure to the input RF voltage signal, and the self-reconfigurable transconductance stage presents the topology structure of the negative feedback amplifier to the fed-back IF signal. The self-reconfigurable transconductance stage circuit achieves a high-linearity IF gain while providing a high bandwidth for the RF signal, effectively alleviating the contradiction between the conversion gain and the IF linearity in the conventional returnable structure.

2 Claims, 1 Drawing Sheet

(58) Field of Classification Search
USPC .......................................................... 327/355
See application file for complete search history.

(56) References Cited

FOREIGN PATENT DOCUMENTS

| | | |
|---|---|---|
| CN | 103051288 A | 4/2013 |
| CN | 103236821 A | 8/2013 |
| EP | 0864207 A1 | 9/1998 |

* cited by examiner

SELF-RECONFIGURABLE RETURNABLE MIXER

TECHNICAL FIELD

The present invention relates to a self-reconfigurable returnable mixer, belonging to the mixer technology.

BACKGROUND

In a radio frequency (RF) receiving system, the mixer is responsible for converting a RF signal to a baseband or an intermediate frequency (IF) band, which is a core module in a receiving link, and as a link of a RF signal and an IF signal, the power consumption level of the mixer occupies a considerable share in a receiving link. Therefore, in order to achieve low power consumption of the overall receiving circuit, the optimization design of the power consumption of the mixer is very crucial. Besides, the mixer requires to have sufficiently high conversion gain to restrain the influence of a high noise factor of the IF module on the entire receiving link.

In view of the above background, in recent years, a new structure referred to as a returnable mixer is proposed and applied. The main idea of the returnable mixer is that the RF transconductance stage is multiplexed and is used to amplify the RF signals and amplify the frequency-converted IF signals at the same time. However, in order to obtain a sufficiently high transconductance value at the RF, the transconductance stage generally uses a common-source open-loop structure in the design process of the returnable structure. The structure also has an effect of amplifying the IF signals, the linearity of the IF signal is severely restricted due to the limitation of the open-loop structure of the IF signal.

SUMMARY

The objective of the invention is as follows. In order to overcome the deficiencies in the prior art, the present invention provides a self-reconfigurable returnable mixer, the transconductance stage of the mixer simultaneously functions as a RF transconductance and an IF amplifier: the transconductance stage presents an open-loop structure to the input RF signal to obtain a higher equivalent transconductance; the transconductance stage presents a resistance negative feedback amplifier structure to the IF signal to ensure high degree of linearity.

Technical solution: In order to achieve the above-mentioned purpose, the technical solution used by the present invention is as follows.

A self-reconfigurable returnable mixer includes a self-reconfigurable transconductance stage. The input RF voltage signal is converted into RF current through the self-reconfigurable transconductance stage. The RF current is converted into an IF signal through down-conversion and low-pass filtering. The IF signal is fed back to the self-reconfigurable transconductance stage. The self-reconfigurable transconductance stage presents an open-loop structure to the input RF voltage signal, and the self-reconfigurable transconductance stage presents a topology structure of the negative feedback amplifier to the fed-back IF signal.

The self-reconfigurable transconductance stage provided by the present invention achieves a high degree of linear IF gain while providing high bandwidth for the RF voltage signal, alleviating the contradiction between the conversion gain and the IF linearity in the conventional feedback structure.

Specifically, the self-reconfigurable transconductance stage includes a first PMOS (positive channel Metal Oxide Semiconductor) transistor MP1, a second PMOS transistor MP2, a third PMOS transistor MP3, a fourth PMOS transistor MP4, a fifth PMOS transistor MP5, a sixth PMOS transistor MP6, a first NMOS (N Metal Oxide Semiconductor) transistor MN1, a second NMOS transistor MN2, a fifth NMOS transistor MN5, a sixth NMOS transistor MN6, a first capacitor C1, a second capacitor C2, a third capacitor C3, a fourth capacitor C4, a fifth capacitor C5, a sixth capacitor C6, a seventh capacitor C7, an eighth capacitor C8, a ninth capacitor C9, a tenth capacitor C10, an eleventh capacitor C11, a twelfth capacitor C12, a first resistor R1, a second resistor R2, a third resistor R3, a fourth resistor R4, a fifth resistor R5, a sixth resistor R6, a seventh resistor R7, an eighth resistor R8, a ninth resistor R9 and a tenth resistor R10.

The source of the first PMOS transistor MP1 is connected to the supply voltage, the gate of MP1 is connected to the lower electrode plate of the third capacitor C3, the drain of MP1 is connected to the source of the third PMOS transistor MP3. The gate of the third PMOS transistor MP3 is connected to the bias voltage Vb1, the drain of MP3 is connected to the drain of the fifth NMOS transistor MN5. The gate of the fifth NMOS transistor MN5 is connected to the bias voltage Vb2, the source of MN5 is connected to the drain of the first NMOS transistor MN1. The gate of the first NMOS transistor MN1 is connected to the lower electrode plate of the ninth capacitor C9, the source of MN1 is grounded. The gate of the fifth PMOS transistor MP5 is connected to the lower electrode plate of the first capacitor C1, the source of MP5 is connected to the power source, the drain of MP5 is connected to the lower electrode plate of the fifth capacitor C5. The upper electrode plate of the first capacitor C1, the upper electrode plate of the third capacitor C3 and the upper electrode plate of the ninth capacitor C9 are connected to the positive terminal of input voltage Vinp. The upper electrode plate of the fifth capacitor C5 is connected to the drain of the first PMOS transistor MP1. The upper electrode plate of the seventh capacitor C7 is connected to the drain of the third PMOS transistor MP3. The upper electrode plate of the eleventh capacitor C11 is connected to the drain of the first NMOS transistor MN1. The lower electrode plate of the fifth capacitor C5, the lower electrode plate of the seventh capacitor C7 and the lower electrode plate of the eleventh capacitor C11 are connected to the drain of the fifth PMOS transistor MP5. The positive terminal of the first resistor R1 is connected to the gate of the first PMOS transistor MP1, the negative terminal of R1 is connected to the reference voltage Vb0. The positive terminal of the third resistor R3 is connected to the reference Voltage Vb0, the negative terminal of R3 is connected to the drain of the third PMOS transistor MP3. The positive terminal of the fifth resistor R5 is connected to the drain of the third PMOS transistor MP3, the negative terminal of R5 is connected to the gate of the first NMOS transistor MN1. The positive terminal of the ninth resistor R9 is connected to the gate of the first NMOS transistor MN1, the negative terminal is connected to the drain of the third NMOS transistor MN3. The positive terminal of the seventh resistor R7 is connected to the gate of the fifth PMOS transistor MP5, the negative of R7 is connected to the reference voltage Vb3.

The source of the second PMOS transistor MP2 is connected to the supply voltage, the gate of MP2 is connected to the lower electrode plate of the fourth capacitor C4, the drain of MP2 is connected to the source of the fourth PMOS transistor MP4. The gate of the fourth PMOS transistor MP4 is connected to the bias voltage Vb1, the drain of MP4 is connected to the drain of the sixth NMOS transistor MN6. The gate of the sixth NMOS transistor MN6 is connected to the bias voltage Vb2, the source of MN6 is connected to the drain of the second NMOS transistor MN2. The gate of the second NMOS transistor MN2 is connected to the lower electrode plate of the tenth capacitor C10, the source of MN2 is grounded. The gate of the sixth PMOS transistor MP6 is connected to the lower electrode plate of the second capacitor C2, the source of MP6 is connected to the power source, the drain of MP6 is connected to the lower electrode plate of the sixth capacitor C6. The upper electrode plate of the second capacitor C2, the upper electrode plate of the fourth capacitor C4 and the upper electrode plate of the tenth capacitor C10 are connected to the negative terminal of input voltage Vinn. The upper electrode plate of the sixth capacitor C6 is connected to the drain of the second PMOS transistor MP2. The upper electrode plate of the eighth capacitor C8 is connected to the drain of the fourth PMOS transistor MP4. The upper electrode plate of the twelfth capacitor C12 is connected to the drain of the second NMOS transistor MN2. The lower electrode plate of the sixth capacitor C6, the lower electrode plate of the eighth capacitor C8 and the lower electrode plate of the twelfth capacitor C12 are connected to the drain of the sixth PMOS transistor MP6. The positive terminal of the second resistor R2 is connected to the gate of the second PMOS transistor MP2, the negative terminal of R2 is connected to the reference voltage Vb0. The positive terminal of the fourth resistor R4 is connected to the reference Voltage Vb0, the negative terminal of R4 is connected to the drain of the fourth PMOS transistor MP4. The positive terminal of the sixth resistor R6 is connected to the drain of the fourth PMOS transistor MP4, the negative terminal of R6 is connected to the gate of the second NMOS transistor MN2. The positive terminal of the tenth resistor R10 is connected to the gate of the second NMOS transistor MN2, the negative terminal of R10 is connected to the drain of the fourth NMOS transistor MN4. The positive terminal of the eighth resistor R8 is connected to the gate of the sixth PMOS transistor MP6, the negative terminal of R8 is connected to the reference voltage Vb3.

Specifically, the self-reconfigurable returnable mixer further includes a double balanced switch and a load stage. The double-balanced switch and the load stage include a seventh PMOS transistor MP7, an eighth PMOS transistor MP8, a ninth PMOS transistor MP9, a tenth PMOS transistor MP10, a third NMOS transistor MN3, a fourth NMOS transistor MN4, an eleventh resistor R11, a twelfth resistor R12, a thirteenth resistor R13, a fourteenth resistor R14, a thirteenth capacitor C13, a fourteenth capacitor C14, a fifteenth capacitor C15, a sixteenth capacitor C16 and a seventeenth capacitor C17;

The gate of the seventh PMOS transistor MP7 is connected to the negative terminal of the local oscillator, the source of MP7 is connected to the lower electrode plate of the fifth capacitor C5, the drain of MP7 is connected to the drain of the third NMOS transistor MN3. The gate of the eighth PMOS transistor MP8 is connected to the negative terminal of the local oscillator, the source of MP8 is connected to the lower electrode plate of the sixth capacitor C6, the drain of MP8 is connected to the drain of the fourth NMOS transistor MN4. The source of the ninth PMOS transistor MP9 is connected to the lower electrode plate of the fifth capacitor C5, the gate of MP9 is connected to the positive terminal of the local oscillator, the drain of MP9 is connected to the drain of the fourth NMOS transistor MN4. The source of the tenth PMOS transistor MP10 is connected to the lower electrode plate of the sixth capacitor C6, the gate of MP10 is connected to the positive terminal of the local oscillator, the drain of MP10 is connected to the drain of the third NMOS transistor MN3. The gate of the third NMOS transistor MN3 is connected to the gate of the fourth NMOS transistor MN4, the source of the third NMOS transistor MN3 is grounded, the drain of MN3 is connected to the negative terminal of the ninth resistor R9. The source of the fourth NMOS transistor MN4 is grounded, the drain of MN4 is connected to the negative terminal of the tenth resistor R10. The positive terminal of the eleventh resistor R11 is connected to the drain of the third NMOS transistor MN3, the negative terminal of R11 is connected to the gate of the third NMOS transistor MN3. The positive terminal of the twelfth resistor R12 is connected to the drain of the fourth NMOS transistor MN4, the negative terminal of R12 is connected to the gate of the fourth NMOS transistor MN4. The positive terminal of the thirteenth resistor R13 is connected to the drain of the fifth NMOS transistor MN5, the negative terminal of R13 is connected to the positive terminal of the output voltage. The positive terminal of the fourteenth resistor R14 is connected to the drain of the fourth NMOS transistor MN4, the negative terminal of R14 is connected to the negative terminal of the output voltage. The positive terminal of the thirteenth capacitor C13 is connected to the drain of the third NMOS transistor MN3, the negative terminal of C13 is connected to the drain of the fourth NMOS transistor MN4. The positive terminal of the fourteenth capacitor C14 is connected to the drain of the third NMOS transistor MN3, the negative terminal of C14 is grounded. The positive terminal of the fifteenth capacitor C15 is connected to the drain of the fourth NMOS transistor MN4, the negative terminal of C15 is grounded. The positive terminal of the sixteenth capacitor C16 is connected to the negative terminal of the thirteenth resistor R13, the negative terminal of C16 is grounded. The positive terminal of the seventeenth capacitor C17 is connected to the negative terminal of the fourteenth resistor R14, the negative terminal of C17 is grounded.

The advantages are as follows. The core of the self-reconfigurable returnable mixer provided by the present invention is self-reconfigurable transconductance stage. The self-reconfigurable transconductance stage presents an open-loop structure to the input radio frequency, ensuring a high RF transconductance value. The frequency-converted IF signal is re-fed to the self-reconfigurable transconductance stage. Meanwhile, the self-reconfigurable transconductance stage presents the topology structure of the resistance negative feedback amplifier to the IF signal, thereby ensuring the linearity of the IF gain. Compared with the conventional returnable mixer, the present invention significantly improves the degree of gain linearity of the transconductance stage to the IF signal.

DETAILED DESCRIPTION

The present invention will be further described below with reference to the drawings.

The present invention provides a self-reconfigurable returnable mixer. The self-reconfigurable transconductance stage of the mixer simultaneously functions as a RF transconductance and an IF amplifier. The transconductance stage presents an open-loop structure to the input RF signal to obtain a higher equivalent transconductance, and the transconductance stage presents a negative resistance feedback amplifier structure to the IF signal, which ensures a higher linearity.

Figure 1:
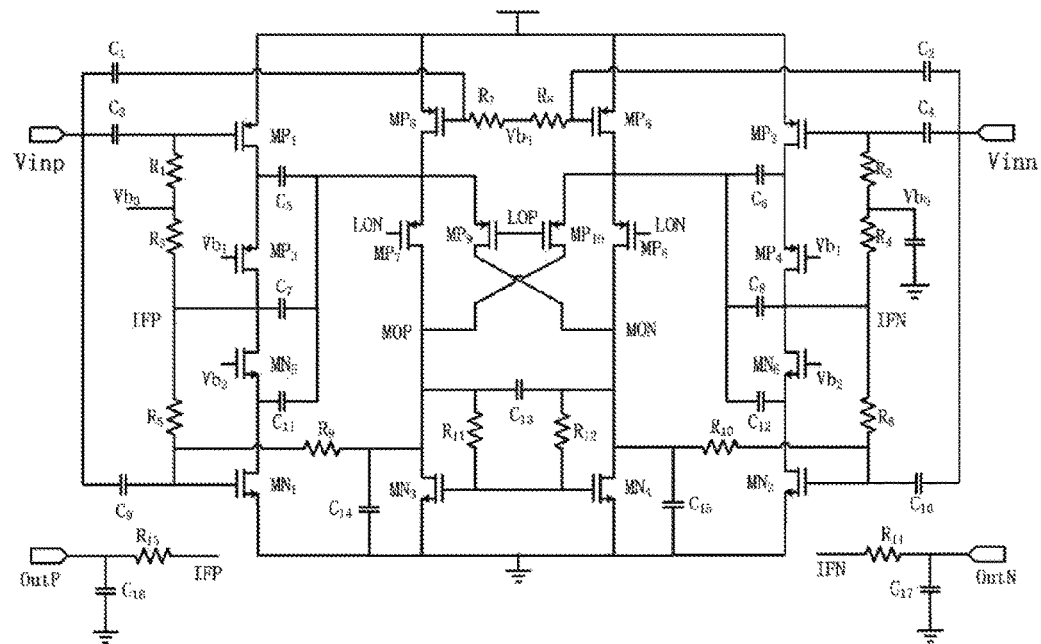
FIG. 1 is a circuit diagram of a self-reconfigurable returnable mixer of the present invention.

As shown in FIG. 1, the circuit structural diagram of the self-reconfigurable returnable mixer includes a self-reconfigurable transconductance stage, a double balanced switch and a load stage.

The self-reconfigurable transconductance stage includes the first PMOS transistor MP1, the second PMOS transistor MP2, the third PMOS transistor MP3, the fourth PMOS transistor MP4, the fifth PMOS transistor MP5, the sixth PMOS transistor MP6, the first NMOS transistor MN1, the second NMOS transistor MN2, the fifth NMOS transistor MN5, the sixth NMOS transistor MN6, the first capacitor C1, the second capacitor C2, the third capacitor C3, the fourth capacitor C4, the fifth capacitor C5, the sixth capacitor C6, the seventh capacitor C7, the eighth capacitor C8, the ninth capacitor C9, the tenth capacitor C10, the eleventh capacitor C11, the twelfth capacitor C12, the first resistor R1, the second resistor R2, the third resistor R3, the fourth resistor R4, the fifth resistor R5, the sixth resistor R6, the seventh resistor R7, the eighth resistor R8, the ninth resistor R9 and the tenth resistor R10.

The circuit structure of the self-reconfigurable transconductance stage is as follows. The source of the first PMOS transistor MP1 is connected to the supply voltage, the gate of MP1 is connected to the lower electrode plate of the third capacitor C3, the drain of MP1 is connected to the source of the third PMOS transistor MP3. The gate of the third PMOS the transistor MP3 is connected to the bias voltage Vb1, the drain of MP3 is connected to the drain of the fifth NMOS transistor MN5. The gate of the fifth NMOS transistor MN5 is connected to the bias voltage Vb2, the source of MN5 is connected to the drain of the first NMOS transistor MN1. The gate of the NMOS transistor MN1 is connected to a lower electrode plate of the ninth capacitor C9, the source of MN1 is grounded. The gate of the fifth PMOS transistor MP5 is connected to the lower electrode plate of the first capacitor C1, the source of MP5 is connected to the power source, the drain of MP5 is connected to the lower electrode plate of the fifth capacitor C5. The upper electrode plate of the first capacitor C1, the upper electrode plate of the third capacitor C3 and the upper electrode plate of the ninth capacitor C9 are connected to the positive terminal of the input voltage Vinp. The upper electrode plate of the fifth capacitor C5 is connected to the drain of the first PMOS transistor MP1. The upper electrode plate of the seventh capacitor C7 is connected to the drain of the third PMOS transistor MP3. The upper electrode plate of the eleventh capacitor C11 is connected to the drain of the first NMOS transistor MN1. The lower electrode plate of the fifth capacitor C5, the lower electrode plate of the seventh capacitor C7 and the lower electrode plate of the eleventh capacitor C11 are connected to the drain of the fifth PMOS transistor MP5. The positive terminal of the first resistor R1 is connected to the gate of the first PMOS transistor MP1, the negative terminal of R1 is connected to the reference voltage Vb0. The positive terminal of the third resistor R3 is connected to the reference voltage Vb0, the negative terminal of R3 is connected to the drain of the third PMOS transistor MP3. The positive terminal of the fifth resistor R5 is connected to the drain of the third PMOS transistor MP3, the negative terminal of R5 is connected to the gate of the first NMOS transistor MN1. The positive terminal of the resistor R9 is connected to the gate of the first NMOS transistor MN1, the negative terminal of the resistor R9 is connected to the drain of the third NMOS transistor MN3. The positive terminal of the seventh resistor R7 is connected to the gate of the fifth PMOS transistor MP5, the negative terminal of the seventh resistor R7 is connected to the reference voltage Vb3. The source of the second PMOS transistor MP2 is connected to the supply voltage, the gate of MP2 is connected to the lower electrode plate of the fourth capacitor C4, the drain of MP2 is connected to the source of the fourth PMOS transistor MP4. The gate of the fourth PMOS transistor MP4 is connected to the bias voltage Vb1, the drain of MP4 is connected the drain of the sixth NMOS transistor MN6. The gate of the sixth NMOS transistor MN6 is connected to the bias voltage Vb2, the source of MN6 is connected to the drain of the second NMOS transistor MN2. The gate of the second NMOS transistor MN2 is connected to the lower electrode plate of the tenth capacitor C10, the source of MN2 is grounded. The gate of the sixth PMOS transistor MP6 is connected to the lower electrode plate of the second capacitor C2, the source of MP6 is connected to the power source, the drain of MP6 is connected to the lower electrode plate of the sixth capacitor C6. The upper electrode plate of the second capacitor C2, the upper electrode plate of the fourth capacitor C4 and the upper electrode plate of the tenth capacitor C10 are connected to the negative terminal of the input voltage Vinn. The upper electrode plate of the sixth capacitor C6 is connected to the drain of the second PMOS transistor MP2. The upper electrode plate of the eighth capacitor C8 is connected to the drain of the fourth PMOS transistor MP4. The upper electrode plate of the twelfth capacitor C12 is connected to the drain of the second NMOS transistor MN2. The lower electrode plate of the sixth capacitor C6, the lower electrode plate of the eighth capacitor C8 and the lower electrode plate of the twelfth capacitor C12 are connected to the drain of the sixth PMOS transistor MP6. The positive terminal of the second resistor R2 is connected to the gate of the second PMOS transistor MP2, the negative terminal of R2 is connected to the reference voltage Vb0. The positive terminal of the fourth resistor R4 is connected to the reference Voltage Vb0, the negative terminal of R4 is connected to the drain of the fourth PMOS transistor MP4. The positive terminal of the sixth resistor R6 is connected to the drain of the fourth PMOS transistor MP4, the negative terminal of R6 is connected to the gate of the second NMOS transistor MN2. The positive terminal of the tenth resistor R10 is connected to the gate of the second NMOS transistor MN2, the negative terminal of R10 is connected to the drain of the fourth NMOS transistor MN4. The positive terminal of the eighth resistor R8 is connected to the gate of the sixth PMOS transistor MP6, the negative terminal of the eighth resistor R8 is connected to the reference voltage Vb3.

The double balanced switch and the load stage include a seventh PMOS transistor MP7, an eighth PMOS transistor MP8, a ninth PMOS transistor MP9, a tenth PMOS transistor MP10, a third NMOS transistor MN3, a fourth NMOS transistor MN4, an eleventh resistor R11, a twelfth resistor R12, a thirteenth resistor R13, a fourteenth resistor R14, a thirteenth capacitor C13, a fourteenth capacitor C14, a fifteenth capacitor C15, a sixteenth capacitor C16 and a seventeenth capacitor C17.

The circuit structure of the double balanced switch and the load stage is as follows. The gate of the seventh PMOS transistor MP7 is connected to the negative terminal of the local oscillator, the source of MP7 is connected to the lower electrode plate of the fifth capacitor C5, the drain MP7 is connected to the drain of the third NMOS transistor MN3. The gate of the eighth PMOS transistor MP8 is connected to the negative terminal of the local oscillator, the source of MP8 is connected to the lower electrode plate of the sixth capacitor C6, the drain of MP8 is connected to the drain of the fourth NMOS transistor MN4. The source of the ninth PMOS transistor MP9 is connected to the lower electrode plate of the fifth capacitor C5, the gate of MP9 is connected to the positive terminal of the local oscillator, the drain of MP9 is connected to the drain of the fourth NMOS transistor MN4. The source of the tenth PMOS transistor MP10 is connected to the lower electrode plate of the sixth capacitor C6, the gate of MP10 is connected to the positive terminal of the local oscillator, the drain of MP10 is connected to the drain of the third NMOS transistor MN3. The gate of the third NMOS transistor MN3 is connected to the gate of the fourth NMOS transistor MN4. The source of the third NMOS transistor MN3 is grounded, the drain of MN3 is connected to the negative terminal of the ninth resistor R9. The source of the fourth NMOS transistor MN4 is grounded, the drain of MN4 is connected to the negative terminal of the tenth resistor R10. The positive terminal of the eleventh resistor R11 is connected to the drain of the third NMOS transistor MN3, the negative terminal of R11 is connected to the gate of the third NMOS transistor MN3. The positive terminal of the twelfth resistor R12 is connected to the drain of the fourth NMOS transistor MN4, the negative terminal of R12 is connected to the gate of the fourth NMOS transistor MN4. The positive terminal of the thirteenth resistor R13 is connected to the drain of the fifth NMOS transistor MN5, the negative terminal of R13 is connected to the positive terminal of the output voltage. The positive terminal of the fourteenth resistor R14 is connected to the drain of the fourth NMOS transistor MN4, the negative terminal of R14 is connected to the negative terminal of the output voltage. The positive terminal of the thirteenth capacitor C13 is connected to the drain of the third NMOS transistor MN3, the negative terminal of C13 is connected to the drain of the fourth NMOS transistor MN4. The positive terminal of the fourteenth capacitor C14 is connected to the drain of the third NMOS transistor MN3, the negative terminal of C14 is grounded. The positive terminal of the fifteenth capacitor C15 is connected to the drain of the fourth NMOS transistor MN4, the negative terminal of C15 is grounded. The positive terminal of the capacitor C16 is connected to the negative terminal of the thirteenth resistor R13, the negative terminal of C16 is grounded. The positive terminal of the seventeenth capacitor C17 is connected to the negative terminal of the fourteenth resistor R14, the negative terminal of C17 is grounded.

The core of the returnable mixer of the present invention is a self-reconfigurable transconductance stage. The transconductance stage presents an open-loop structure to the input RF, which ensures a high RF transconductance value. The frequency-converted IF signal is re-fed to the self-reconfigurable transconductance stage. At this time, the transconductance stage presents the topology structure of the negative feedback amplifier to the IF signal, thereby ensuring the linearity of the IF gain. The reconfigurable transconductance stage has a cascode structure, it is convenient to provide sufficient open-loop gain to the IF signal to achieve a higher closed-loop linearity. For RF signals, the source and drain of the cascode transistor are coupled to the input end of the switching stage through the capacitor, so that presents a common-source transconductance structure, ensuring a high equivalent transconductance.

Figure 2:
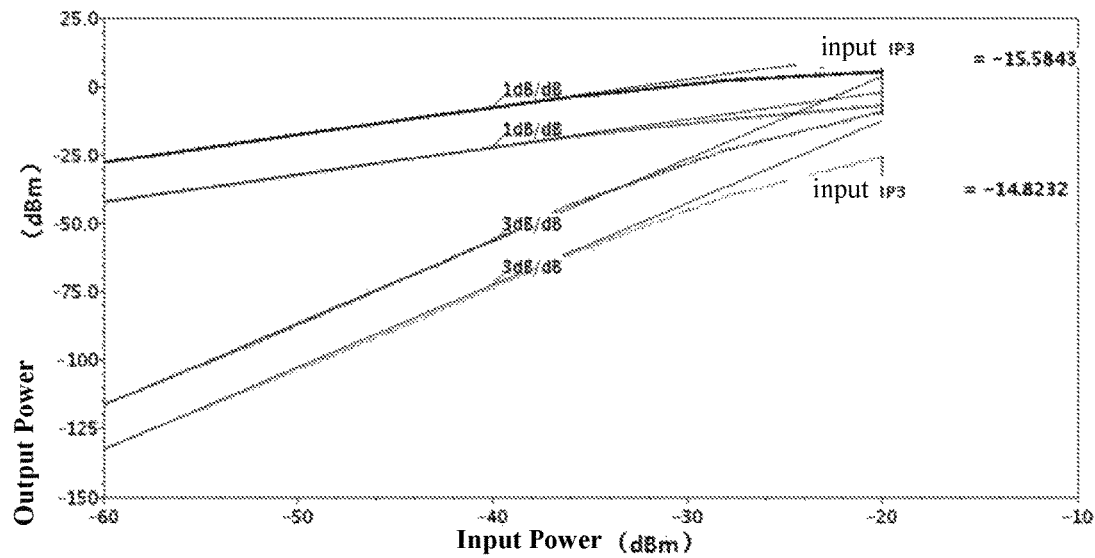
FIG. 2 is a dual tone test chart of the self-reconfigurable returnable mixer of the present invention at the output end of the mixer switch and the total output end, respectively.

FIG. 2 shows the dual tone test simulation curve of the mixer switch output stage and the circuit final output stage. Since the self-reconfigurable transconductance stage ensures a high IF linearity, the fundamental frequency signals parallel with the IM3 signals respectively, and the final IIP3 value is very close. Since this transconductance stage simultaneously provides the IF gain, the fundamental frequency signal and the IM3 signal observed at the output end are about 15 dB higher than the mixer switching stage. Therefore, it may be considered that the present invention increases the conversion gain by about 15 dB without increasing the extra power consumption and causing the degradation of the linearity, and the OIP3 is also promoted equally.

The above description is only a preferred embodiment of the present invention, and it should be noted that those of ordinary skill in the art may also make several improvements and modifications without departing from the principle of the present invention. These improvements and modifications should be regarded as the protection scope of the present invention.

What is claimed is:
1. A self-reconfigurable returnable mixer, comprising:
a self-reconfigurable transconductance stage, an input RF voltage signal is converted into a RF current through the self-reconfigurable transconductance stage, the RF current is converted into an IF signal by down-conversion and low-pass filtering, the IF signal is fed back to the reconfigurable transconductance stage;
wherein, the self-reconfigurable transconductance stage presents an open-loop structure to the input RF voltage signal, the self-reconfigurable transconductance stage presents a topology structure of a negative feedback amplifier to the fed-back IF signal;
wherein, the self-reconfigurable transconductance stage comprises a first PMOS transistor MP1, a second PMOS transistor MP2, a third PMOS transistor MP3, a fourth PMOS transistor MP4, a fifth PMOS transistor MP5, a sixth PMOS transistor MP6, a first NMOS transistor MN1, a second NMOS transistor MN2, a fifth NMOS transistor MN5, a sixth NMOS transistor MN6, a first capacitor C1, a second capacitor C2, a third capacitor C3, a fourth capacitor C4, a fifth capacitor C5, a sixth capacitor C6, a seventh capacitor C7, an eighth capacitor C8, a ninth capacitor C9, a tenth capacitor C10, an eleventh capacitor C11, a twelfth capacitor C12, a first resistor R1, a second resistor R2, a third resistor R3, a fourth resistor R4, a fifth resistor R5, a sixth resistor R6, a seventh resistor R7, an eighth resistor R8, a ninth resistor R9 and a tenth resistor R10;
a source of the first PMOS transistor MP1 is connected to a supply voltage, a gate of the MP1 is connected to a lower electrode plate of the third capacitor C3, a drain of the MP1 is connected to a source of the third PMOS transistor MP3;
a gate of the third PMOS transistor MP3 is connected to a bias voltage Vb1, a drain of the MP3 is connected to a drain of the fifth NMOS transistor MN5;

a gate of the fifth NMOS transistor MN5 is connected to a bias voltage Vb2, a source of the MN5 is connected to a drain of the first NMOS transistor MN1;

a gate of the first NMOS transistor MN1 is connected to a lower electrode plate of the ninth capacitor C9, a source of the MN1 is grounded;

a gate of the fifth PMOS transistor MP5 is connected to the lower electrode plate of the first capacitor C1, a source of the MP5 is connected to the power source, a drain of the MP5 is connected to the lower electrode plate of the fifth capacitor C5;

an upper electrode plate of the first capacitor C1, an upper electrode plate of the third capacitor C3 and an upper electrode plate of the ninth capacitor C9 are connected to a positive terminal of an input voltage Vinp;

an upper electrode plate of the fifth capacitor C5 is connected to the drain of the first PMOS transistor MP1;

an upper electrode plate of the seventh capacitor C7 is connected to the drain of the third PMOS transistor MP3;

an upper electrode plate of the eleventh capacitor C11 is connected to a drain of the first NMOS transistor MN1;

a lower electrode plate of the fifth capacitor C5, a lower electrode plate of the seventh capacitor C7 and a lower electrode plate of the eleventh capacitor C11 are connected to the drain of the fifth PMOS transistor MP5;

a positive terminal of the first resistor R1 is connected to the gate of the first PMOS transistor MP1, a negative terminal of the R1 is connected to a reference voltage Vb0;

a positive terminal of the third resistor R3 is connected to the reference voltage Vb0, a negative terminal of the R3 is connected to the drain of the third PMOS transistor MP3;

a positive terminal of the fifth resistor R5 is connected to the drain of the third PMOS transistor MP3, a negative terminal of R5 is connected to the gate of the first NMOS transistor MN1;

a positive terminal of the ninth resistor R9 is connected to the gate of the NMOS transistor MN1, a negative terminal of the R9 is connected to the drain of the third NMOS transistor MN3;

a positive terminal of the seventh resistor R7 is connected to the gate of the fifth PMOS transistor MP5, a negative terminal of the seventh resistor R7 is connected to a reference voltage Vb3;

a source of the second PMOS transistor MP2 is connected to the supply voltage, a gate of the second PMOS transistor is connected to a lower electrode plate of the fourth capacitor C4, the drain of the second PMOS transistor MP2 is connected to a source of the fourth PMOS transistor MP4;

a gate of the fourth PMOS transistor MP4 is connected to the bias voltage Vb1, the drain of the MP4 is connected to a drain of the sixth NMOS transistor MN6;

a gate of the sixth NMOS transistor MN6 is connected to the bias voltage Vb2, the source of the MN6 is connected to a drain of the second NMOS transistor MN2;

a gate of the second NMOS transistor MN2 is connected to a lower electrode plate of the tenth capacitor C10, a source of MN2 is grounded;

a gate of the sixth PMOS transistor MP6 is connected to a lower electrode plate of the second capacitor C2, a source of MP6 is connected to the power source, a drain of MP6 is connected to a lower electrode plate of the sixth capacitor C6;

an upper electrode plate of the second capacitor C2, an upper electrode plate of the fourth capacitor C4 and an upper electrode plate of the tenth capacitor C10 are connected to a negative terminal of the input voltage Vinn;

an upper electrode plate of the sixth capacitor C6 is connected to the drain of the second PMOS transistor MP2;

an upper electrode plate of the eighth capacitor C8 is connected to a drain of the fourth PMOS transistor MP4;

an upper electrode plate of the twelfth capacitor C12 is connected to the drain of the second NMOS transistor MN2;

the lower electrode plate of the sixth capacitor C6, the lower electrode plate of the eighth capacitor C8 and a lower electrode plate of the twelfth capacitor C12 are connected to the drain of the sixth PMOS transistor MP6;

a positive terminal of the second resistor R2 is connected to the gate of the second PMOS transistor MP2, a negative terminal of the R2 is connected to the reference voltage Vb0;

a positive terminal of the fourth resistor R4 is connected to the reference voltage Vb0, a negative terminal of the R4 is connected the drain of the fourth PMOS transistor MP4;

a positive terminal of the sixth resistor R6 is connected to the drain of the fourth PMOS transistor MP4, a negative terminal of the R6 is connected to the gate of the second NMOS transistor MN2;

a positive terminal of the tenth resistor R10 is connected to the gate of the second NMOS transistor MN2, a negative terminal of the R10 is connected to the drain of the fourth NMOS transistor MN4;

a positive terminal of the eighth resistor R8 is connected to the gate of the sixth PMOS transistor MP6, a negative terminal of the R8 is connected to the reference voltage Vb3.

2. The self-reconfigurable returnable mixer according to claim 1, further comprising:

a double balanced switch and a load stage, the double balanced switch and the load stage comprise a seventh PMOS transistor MP7, an eighth PMOS transistor MP8, a ninth PMOS transistor MP9, a tenth PMOS transistor MP10, a third NMOS transistor MN3, a fourth NMOS transistor MN4, an eleventh resistor R11, a twelfth resistor R12, a thirteenth resistor R13, a fourteenth resistor R14, a thirteenth capacitor C13, a fourteenth capacitor C14, a fifteenth capacitor C15, a sixteenth capacitor C16 and a seventeenth capacitor C17;

a gate of the seventh PMOS transistor MP7 is connected to a negative terminal of a local oscillator, a source of the MP7 is connected to the lower electrode plate of the fifth capacitor C5, a drain of the MP7 is connected to a drain of the third NMOS transistor MN3;

a gate of the eighth PMOS transistor MP8 is connected to the negative terminal of the local oscillator, a source of the MP8 is connected to the lower electrode plate of the sixth capacitor C6, a drain of the MP8 is connected to a drain of the fourth NMOS transistor MN4;

a source of the ninth PMOS transistor MP9 is connected to the lower electrode plate of the fifth capacitor C5, a gate of the MP9 is connected to the positive terminal of the local oscillator, a drain of the MP9 is connected to the drain of the fourth NMOS transistor MN4;

a source of the tenth PMOS transistor MP10 is connected to the lower electrode plate of the sixth capacitor C6, a gate of the MP10 is connected to the positive terminal of the local oscillator, a drain of the MP10 is connected to the drain of the third NMOS transistor MN3;

a gate of the third NMOS transistor MN3 is interconnected with a gate of the fourth NMOS MN4; a source of the third NMOS transistor MN3 is grounded, the drain of the MN3 is connected to the negative terminal of the ninth resistor R9;

a source of the fourth NMOS transistor MN4 is grounded, the drain of the MN4 is connected to the negative terminal of the tenth resistor R10;

a positive terminal of the eleventh resistor R11 is connected to the drain of the third NMOS transistor MN3, a negative terminal of the R11 is connected to the gate of the third NMOS transistor MN3;

a positive terminal of the twelfth resistor R12 is connected to the drain of the fourth NMOS transistor MN4, a negative terminal of the R12 is connected to the gate of the fourth NMOS transistor MN4;

a positive terminal of the thirteenth resistor R13 is connected to the drain of the fifth NMOS transistor MN5, a negative terminal of the R13 is connected to a positive terminal of the output voltage;

a positive terminal of the fourteenth resistor R14 is connected to the drain of the fourth NMOS transistor MN4, a negative terminal of the R14 is connected to a negative terminal of the output voltage;

a positive terminal of the thirteen capacitor C13 is connected to the drain of the third NMOS transistor MN3, a negative terminal of the C13 is connected to the drain of the fourth NMOS transistor MN4;

a positive terminal of the fourteenth capacitor C14 is connected to the drain of the third NMOS transistor MN3, a negative terminal of the C14 is grounded;

a positive terminal of the fifteenth capacitor C15 is connected to the drain of the fourth NMOS transistor MN4, a negative terminal of the C15 is grounded;

a positive terminal of the sixteenth capacitor C16 is connected to the negative terminal of the thirteenth resistor R13, a negative terminal of the C16 is grounded;

a positive terminal of the seventeenth capacitor C17 is connected to the negative terminal of the fourteenth resistor R14, a negative terminal of the C17 is grounded.

* * * * *